(12) United States Patent
Pooniwala et al.

(10) Patent No.: US 10,880,041 B2
(45) Date of Patent: Dec. 29, 2020

(54) APPARATUS FOR TRANSMITTING BROADCAST SIGNAL, APPARATUS FOR RECEIVING BROADCAST SIGNAL, AND METHOD THEREFOR

(71) Applicant: SAMSUNG ELECTRONICS CO., LTD., Suwon-si (KR)

(72) Inventors: Gaurav Pooniwala, Seoul (KR); Young Ho Oh, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/487,700

(22) PCT Filed: Mar. 9, 2017

(86) PCT No.: PCT/KR2017/002584
§ 371 (c)(1),
(2) Date: Aug. 21, 2019

(87) PCT Pub. No.: WO2018/164300
PCT Pub. Date: Sep. 13, 2018

(65) Prior Publication Data
US 2020/0235857 A1   Jul. 23, 2020

(51) Int. Cl.
*H04L 1/06* (2006.01)
*H03M 13/25* (2006.01)
*H04L 1/00* (2006.01)
*H04L 29/06* (2006.01)

(52) U.S. Cl.
CPC ........ *H04L 1/0618* (2013.01); *H03M 13/255* (2013.01); *H04L 1/0041* (2013.01); *H04L 1/0057* (2013.01); *H04L 1/0071* (2013.01); *H04L 65/607* (2013.01)

(58) Field of Classification Search
CPC ............ H03M 13/255; H04N 21/6373; H04N 21/6379; H04L 1/1854; H04L 1/0618; H04L 1/0041; H04L 1/0057; H04L 1/0071; H04L 65/607; H04L 45/00; H04L 45/22; H04L 5/0035; H04L 51/26
See application file for complete search history.

(56) References Cited

U.S. PATENT DOCUMENTS

| | | |
|---|---|---|
| 6,185,258 B1 | 2/2001 | Alamouti et al. |
| 6,775,329 B2 | 8/2004 | Alamouti et al. |
| 7,120,200 B2 | 10/2006 | Alamouti et al. |
| 7,386,077 B2 | 6/2008 | Alamouti et al. |
| 7,587,007 B2 | 9/2009 | Alamouti et al. |

(Continued)

OTHER PUBLICATIONS

International Search Report (PCT/ISA/210) dated Dec. 7, 2017 issued by the International Searching Authority in International Application No. PCT/KR2017/002584.

(Continued)

*Primary Examiner* — Khanh C Tran
(74) *Attorney, Agent, or Firm* — Sughrue Mion, PLLC

(57) ABSTRACT

A transmitting device is disclosed. The transmitting device includes a controller that groups a plurality of transmitters into a plurality of groups including three or more groups and a plurality of code units that generate different output streams based on a data stream with respect to the plurality of groups. The controller delivers the output streams to the plurality of groups.

14 Claims, 15 Drawing Sheets

(56) References Cited

U.S. PATENT DOCUMENTS

| | | | |
|---|---|---|---|
| 7,916,806 B2 | 3/2011 | Alamouti et al. |
| 7,970,046 B2 | 6/2011 | Garth et al. |
| 8,040,867 B2 | 10/2011 | Castelain et al. |
| 8,270,527 B2 | 9/2012 | Castelain et al. |
| 8,355,475 B2 | 1/2013 | Alamouiti et al. |
| 8,625,508 B2 | 1/2014 | Jeong et al. |
| 8,717,947 B2 | 5/2014 | Liao et al. |
| 8,767,874 B2 | 7/2014 | Alamouti et al. |
| 9,088,318 B2 | 7/2015 | Liao et al. |
| 9,203,499 B2 | 12/2015 | Alamouti et al. |
| 9,479,233 B2 | 10/2016 | Maltsev et al. |
| 9,749,032 B2 | 8/2017 | Alamouti et al. |
| 9,768,841 B2 | 9/2017 | Maltsev et al. |
| 10,177,825 B2 | 1/2019 | Maltsev et al. |
| 2003/0219080 A1 | 11/2003 | Alamouti et al. |
| 2004/0234003 A1 | 11/2004 | Alamouti et al. |
| 2007/0110179 A1 | 5/2007 | Alamouti et al. |
| 2008/0008275 A1 | 1/2008 | Alamouti et al. |
| 2008/0063107 A1 | 3/2008 | Alamouti et al. |
| 2008/0080613 A1 | 4/2008 | Garth et al. |
| 2010/0014413 A1 | 1/2010 | Castelain et al. |
| 2010/0091903 A1 | 4/2010 | Castelain et al. |
| 2011/0044313 A1 | 2/2011 | Jeong et al. |
| 2011/0164697 A1 | 7/2011 | Liao et al. |
| 2011/0170635 A1 | 7/2011 | Alamouti et al. |
| 2013/0129012 A1 | 5/2013 | Alamouti et al. |
| 2014/0211877 A1 | 7/2014 | Liao et al. |
| 2014/0314174 A1 | 10/2014 | Alamouti et al. |
| 2015/0208431 A1* | 7/2015 | Chen ................ H04W 4/70 370/329 |
| 2015/0311962 A1 | 10/2015 | Maltsev et al. |
| 2016/0080066 A1 | 3/2016 | Alamouti et al. |
| 2016/0182174 A1* | 6/2016 | Stewart ............. H04H 60/51 348/729 |
| 2016/0227554 A1* | 8/2016 | Zhou ............. H04W 72/0406 |
| 2016/0233936 A1* | 8/2016 | Shim ............... H04B 7/0473 |
| 2016/0301960 A1* | 10/2016 | Sze ............. H04N 21/23805 |
| 2017/0104516 A1 | 4/2017 | Maltsev et al. |
| 2018/0123651 A1 | 5/2018 | Maltsev et al. |
| 2018/0270845 A1* | 9/2018 | Urabayashi ....... H04W 56/0045 |

OTHER PUBLICATIONS

Notification of Transmittal (PCT/ISA/220) and Written Opinion (PCT/ISA/237) dated Dec. 7, 2017 issued by the International Searching Authority in International Application No. PCT/KR2017/002584.

* cited by examiner

APPARATUS FOR TRANSMITTING BROADCAST SIGNAL, APPARATUS FOR RECEIVING BROADCAST SIGNAL, AND METHOD THEREFOR

TECHNICAL FIELD

The disclosure relates to a transmitting device for transmitting broadcasting signals, a receiving device for receiving broadcasting signals, and a method for transmitting and receiving broadcasting signals.

BACKGROUND ART

Digital broadcast technology is a broadcast technique capable of transmitting a large amount of data. A next-generation broadcasting system based on digital video broadcast-terrestrial version 2 (DVB-T2) is adopted in Europe, and advanced television systems committee (ATSC) 3.0 standardization is in progress in the ATSC of the United States.

To provide a high error correction capability and various error coding rates, a DVB-T2 system uses bose-chaudhuri-hocquenghem (BCH) and low density parity check (LDPC) channel coding and interleaving of bits, cells, times, frequencies and adopts a multiple input single output (MISO) diversity technique or the like.

A DVB-T2 MISO technique applies a space time block code (STBC) in different transmit antennas (hereinafter, transmitters) to transmit signals. For example, a transmitting device applies Alamouti coding to transmit signals. The performance of receiving signals in a cell edge through the STBC in a single frequency network may be increased.

DISCLOSURE

Technical Problem

According to a conventional STBC technique, a transmitting device transmits a signal using two transmitters. Various embodiments disclosed in the disclosure propose an STBC technique using more transmitters to enhance signal to noise ratio (SNR) performance in a reception area.

Various embodiments disclosed in the disclosure are to provide a transmitting device for enhancing signal transmission and reception performance in a MISO channel environment, a receiving device, and a transmitting and receiving method.

Technical Solution

In accordance with an aspect of the disclosure, a transmitting device is provided. The transmitting device may include a controller that groups a plurality of transmitters into a plurality of groups including three or more groups and a plurality of code units that generate different output streams based on a data stream with respect to the plurality of groups. The controller may deliver the output streams to the plurality of groups.

In accordance with another aspect of the disclosure, a transmitting method is provided. The transmitting method may include grouping a plurality of transmitters into a plurality of groups including three or more groups and generating different output streams based on a data stream with respect to the plurality of groups.

Advantageous Effects

According to embodiments disclosed in the disclosure, the transmitting device may efficiently transmit a signal via a transmitting device in a cell.

According to embodiments disclosed in the disclosure, signal reception performance may be increased in the receiving device.

In addition, various effects directly or indirectly ascertained through the disclosure may be provided.

MODE FOR INVENTION

Figure 1:
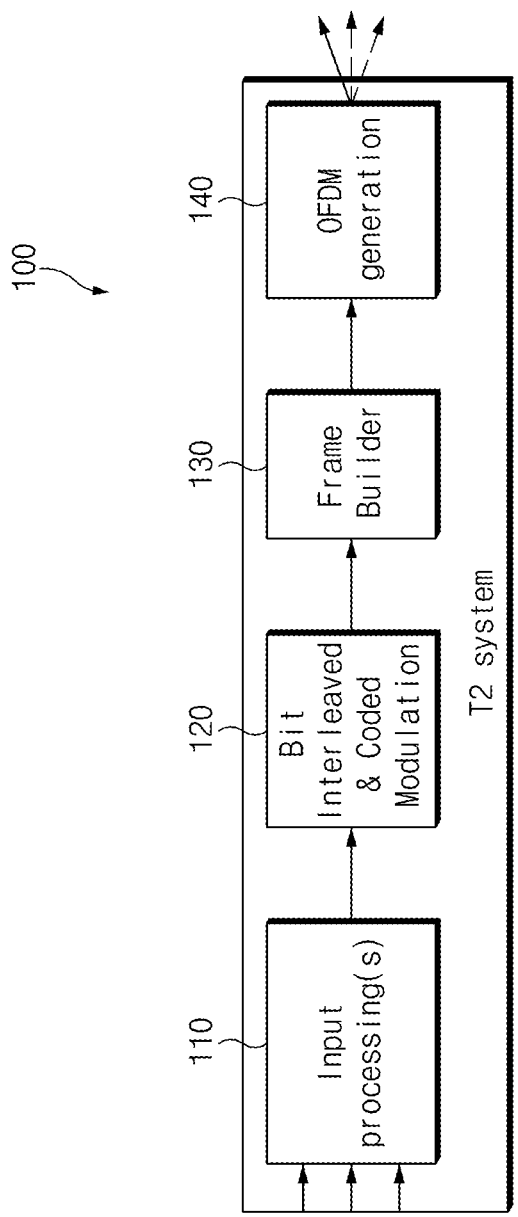
FIG. 1 is a block diagram illustrating a configuration of a transmitting device according to an embodiment.

Hereinafter, various embodiments of the disclosure may be described with reference to accompanying drawings. Accordingly, those of ordinary skill in the art will recognize that modification, equivalent, and/or alternative on the various embodiments described herein can be variously made without departing from the scope and spirit of the disclosure. With regard to description of drawings, similar components may be marked by similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when an component (e.g., a first component) is referred to as being "(operatively or communicatively) coupled with/to" or "connected to" another component (e.g., a second component), it may be directly coupled with/to or connected to the other component or an intervening component (e.g., a third component) may be present. In contrast, when an component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" must not mean only "specifically designed to" in hardware. Instead, the expression "a device configured to" may mean that the device is "capable of" operating together with another device or other parts. For example, a "processor configured to (or set to) perform A, B, and C" may mean a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

Hereinafter, an apparatus and method proposed in an embodiment disclosed in the disclosure is applicable to a digital broadcast system, such as a mobile broadcast service such as a digital multimedia broadcasting (DMB) service, a digital video broadcasting handheld (DVB-H) service, and an advanced television systems committee mobile/handheld (ATSC-M/H) service or an internet protocol television (IPTV) service, a moving picture experts group (MPEG) media transport (MMT) system, and various communication systems such as an evolved packet system (EPS), a long term evolution (LTE) mobile communication system, an LTE-advanced (LTE-A) mobile communication system, a high speed downlink packet access (HSDPA) mobile communication system, a high speed uplink packet access (HSUPA) mobile communication system, a $3^{rd}$ generation project partnership 2 (3GPP2) high rate packet data (HRPD) mobile communication system, a 3GPP2 wideband code division multiple access (WCDMA) mobile communication system, a 3GPP2 code division multiple access (CDMA) mobile communication system, a communication system such as institute of electrical and electronics engineers (IEEE) 802.16m, and a mobile internet protocol (IP) system. Hereinafter, an embodiment disclosed in the disclosure will be described with respect to a DVB-T2 transmission system which is one of European digital broadcasting standards. An operation of a transmitting device or a receiving device, which is not described in the disclosure, may refer to the related standard document "Digital video Broadcasting (DVB); Frame structure channel coding and modulation for a second generation digital terrestrial television".

FIG. 1 is a block diagram illustrating a configuration of a transmitting device according to an embodiment.

Referring to FIG. 1, a transmitting device 100 which transmits a broadcast signal may include an input processing block 110, a bit interleaved and coded modulation (BICM) block 120, a frame builder 130, and an orthogonal frequency division multiplexing (OFDM) generation block 140.

The transmitting device 100 may process a transport stream (TS) or generic stream (GS) signal. One input stream or a plurality of input streams, each of which has a transport stream (TS), generic encapsulated stream (GSE), generic continuous steam (GCS), and/or generic fixed-length packetized stream (GFPS) format, may be input to the input processing block 110 of the transmitting device 100. The one input stream may be delivered through one physical layer pipe (PLP). Each PLP may refer to an independent signal path which transfers one data stream. Hereinafter, the PLP may be referred to as a data stream. The physical layer pipe (PLP) may be a data stream encoded with specific modulation, a code rate, and a length.

The PLP may be a default unit for robustness control. The PLP may have an influence on a quality of service (QoS). One service or a plurality of services may be delivered by a single PLP. The PLP may be referred to as a data pipe. Input processing for a single input stream (or a PLP) may be performed in input mode A, input processing for multiple PLPs may be performed in input mode B.

The output of the transmitting device 100 may be a single signal transmitted on a single radio frequency (RF) channel. In a multi input single output (MISO) transmission mode, the transmitting device 100 may generate an output signal of a specific group, delivered to an antenna of the specific group.

The input processing block 110 may divide each input stream into respective baseband (BB) frames. The input processing block 110 may include a mode adaptation module and a stream adaptation module.

The BICM block 120 may perform forward error coding (FEC) coding depending on an area to which data will be transmitted to generate an FEC frame. The BICM block 120 may perform the forward error coding (FEC) encoding depending on the area to which the data will be transmitted, may interleave the encoded bitstream, and may map the interleaved bitstream to a complex constellation system.

The frame builder 130 and the OFDM generation block 140 may assemble a cell generated by the BICM block 120 to generate an orthogonal frequency division multiplexing (OFDM) frame structure for signaling and may modulate the generated frame into an RF signal to transmit the RF signal to a receiver. A multi input single output (MISO) transmission mode for antenna space diversity is applicable to a transmitter.

Figure 2:
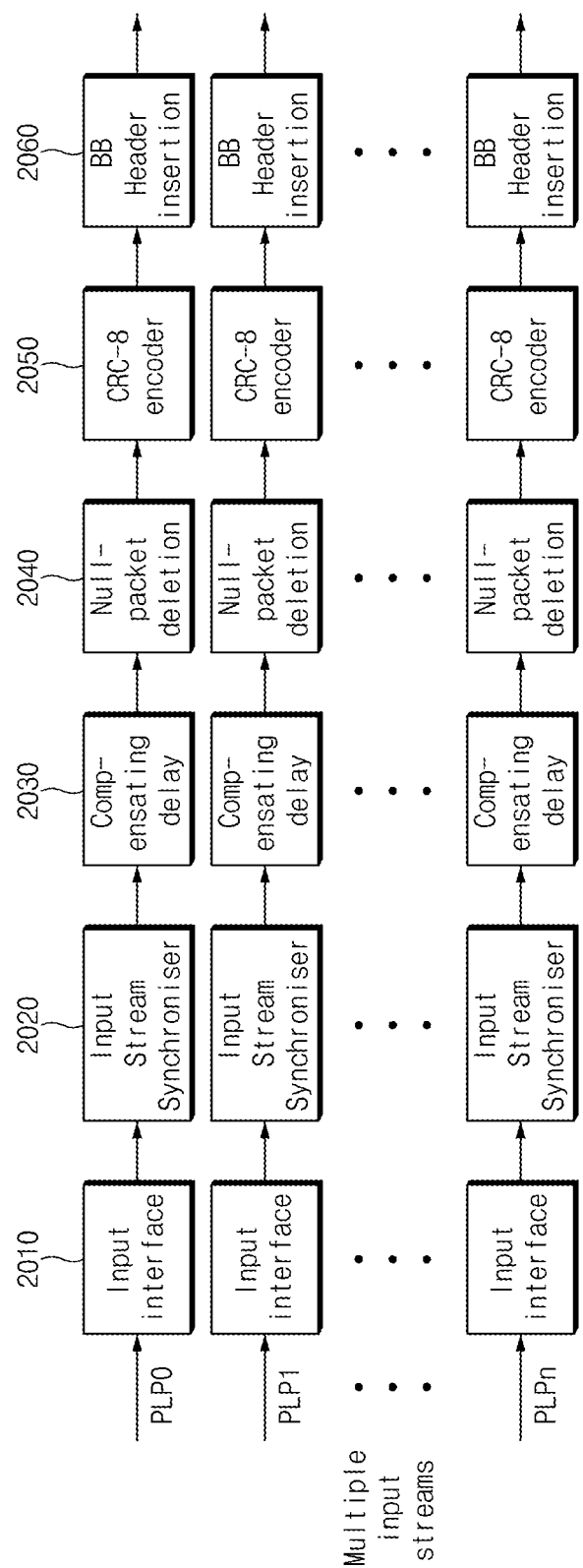
FIG. 2 is a block diagram illustrating a mode adaptation block of an input processing block according to an embodiment.

FIG. 2 is a block diagram illustrating a mode adaptation block of an input processing block according to an embodiment. In a description below, processing for multiple PLPs is described, but an embodiment disclosed in the disclosure is also applicable to a single PLP. A mode adaptation block of an input processing block (e.g., an input processing block 110 of FIG. 1) which receives the multiple PLPs may independently process each input stream.

Referring to FIG. 2, the mode adaptation block may include an input interface block 2010, an input stream synchronizer block 2020, a compensating delay block 2030, a null packet deletion block 2040, a cyclic redundancy check-8 (CRC-8) encoder 2050, and a BB header insertion block 2060.

The input interface block 2010 may divide and output an input stream for each baseband (BB) frame length for performing FEC encoding.

The input stream synchronizer block 2020 may be referred to as an input stream synchronizer (ISSY). The input stream synchronizer block 2020 may provide a means which ensures constant end to end transmission delay and a constant bit rate (CBR) with respect to a specific input data format. The input stream synchronizer block 2020 may be used for a plurality of PLPs which transmit a TS and may be selectively used for a PLP which transmits a GS.

When a delay between PLPs according to data processing of a transmitting device (e.g., a transmitting device 100 of FIG. 1) occurs, the compensating delay block 2030 may delay and output input data to establish synchronization at a receiving device.

The null packet deletion block 2040 is applicable to only a TS input stream. To avoid unnecessary transmission overhead, the null packet deletion block 2040 may remove a null packet. The removed null packet may be inserted into an original location again at a receiver.

The CRC-8 encoder 2050 may be used to detect an error. CRC-8 may be attached behind a user packet (UP).

The BB header insertion block 2060 may insert a BB header of a fixed length before a BB frame. The BB header may have different formats in a normal mode (NM) and a high efficiency mode (HEM). A current mode may be detected by a mode field.

The above-mentioned configuration of the mode adaptation block is merely illustrative to understand an embodiment disclosed in the disclosure, and another configuration having a similar or the same function is applicable to various embodiments.

Figure 3:
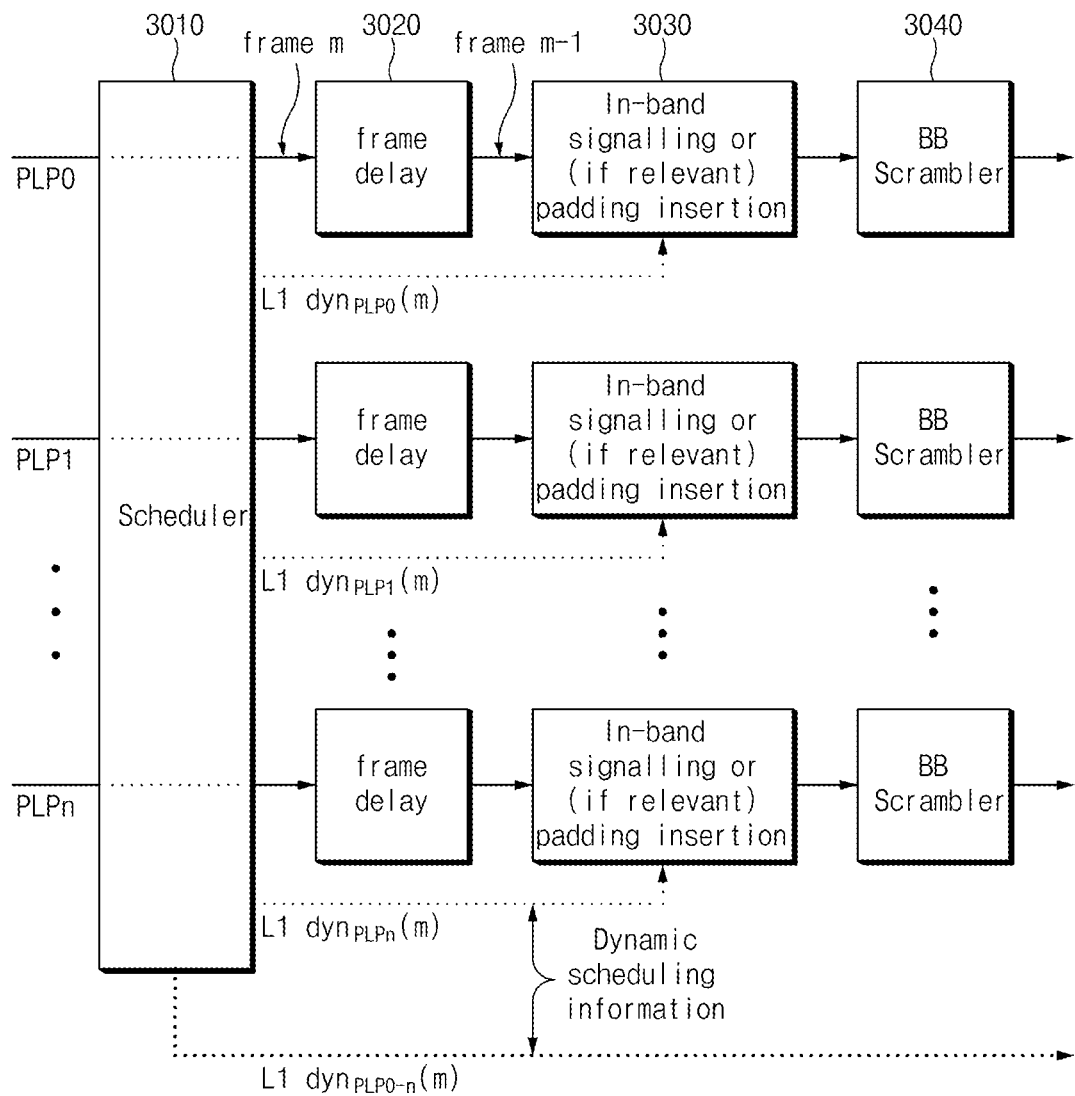
FIG. 3 illustrates a stream adaptation block of an input processing block according to an embodiment.

FIG. 3 illustrates a stream adaptation block of an input processing block according to an embodiment.

Referring to FIG. 3, for a plurality of input streams, the stream adaptation block may include a scheduler 3010, a frame delay block 3020, an in-band signaling or padding insertion block 3030, and a BB scrambler 3040.

The scheduler 3010 may determine a cell which transfers data which belongs to each PLP. The scheduler 3010 may output dynamic scheduling information about a current frame independently of in-band signaling.

The frame delay block 3020 may delay input data by one frame such that scheduling information about a next frame is transmitted in a current frame.

The in-band signaling or padding insertion block 3030 may insert a portion which is not delayed in data into a frame.

The BB scrambler 3040 may randomize a BB frame using a pseudo random binary sequence (PRBS).

The above-mentioned configuration of the stream adaptation block is merely illustrative to understand an embodiment disclosed in the disclosure, and another configuration having a similar or the same function is applicable to various embodiments.

An output of an input processing block (e.g., an input processing block 110 of FIG. 1) may be input to a BICM block (e.g., a BICM block 120 of FIG. 1). The stream adaptation block may output each PLP to the BICM block.

Figure 4:
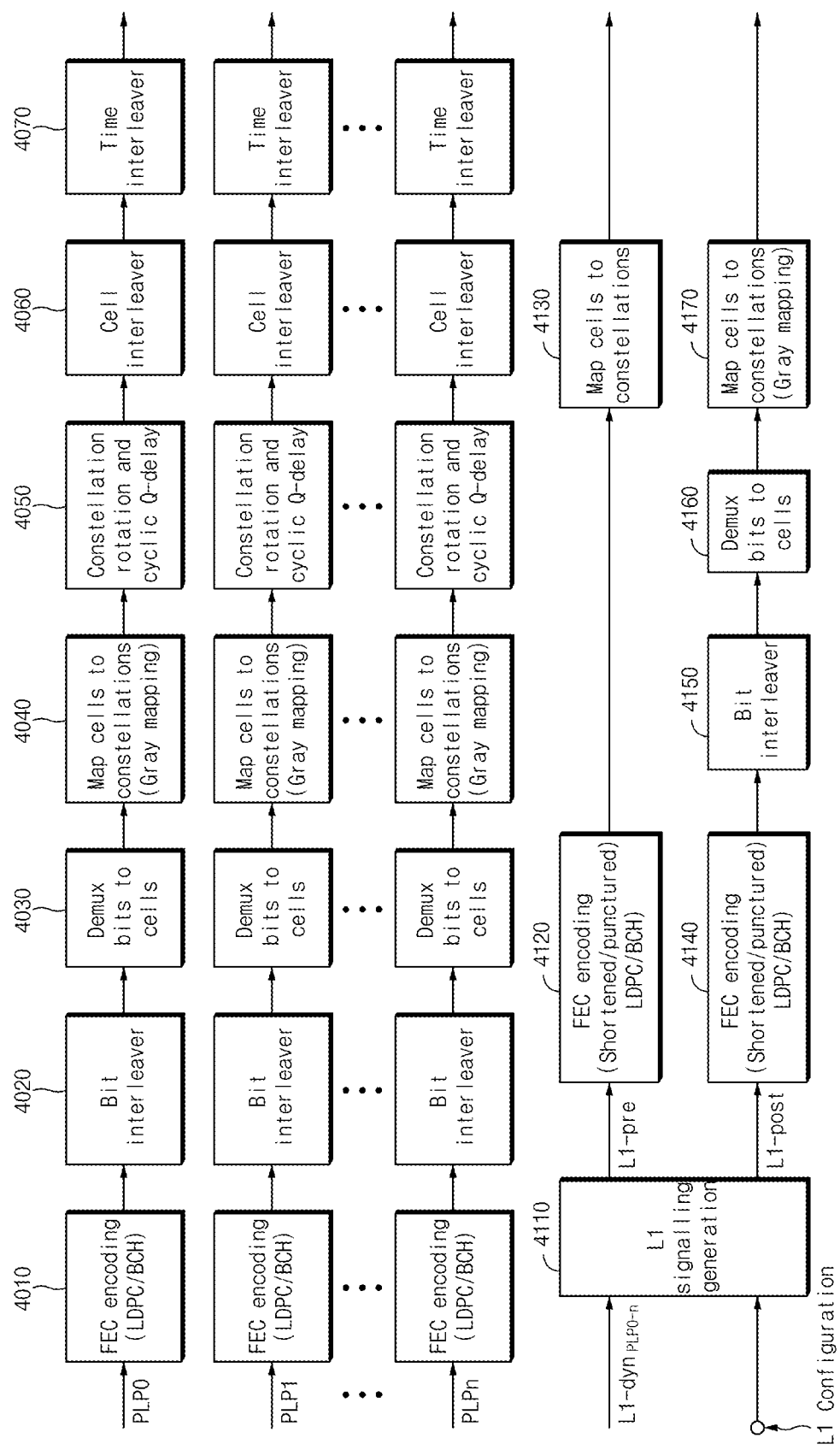
FIG. 4 illustrates a BICM block according to an embodiment.

FIG. 4 illustrates a BICM block according to an embodiment.

FIG. 4 illustrates a BICM block (e.g., a BICM block 120 of FIG. 1) for a plurality of input streams. Receiving the plurality of input streams, the BCIM block independently may process each input stream.

The BICM block may receive a BB frame output from an input processing block (e.g., an input processing block 110 of FIG. 1) and may output an FEC frame. The BICM block may independently apply single input single output (SISO), multi input single output (MISO), and multi input multi output (MIMO) schemes to a PLP. Thus, a transmitting device disclosed in the disclosure may control a QoS for a service or a service component transmitted through each PLP.

The BICM block according to an embodiment may include an FEC encoding block 4010, a bit interleaver 4020, a demux (demux bits to cells) 4030, a constellation mapper (map cells to constellations) 4040, a constellation rotation and cyclic Q-delay block 4050, a cell interleaver 4060, and a time interleaver 4070.

The FEC encoding block 4010 may perform bose-chaudhuri-hocquenghem (BCH) encoding and low density parity check (LDPC) encoding of an input PLP and may add a redundancy.

The bit interleaver 4020 may interleave a bitstream of data in which FEC encoding is performed, depending on an interleaving rule to have robustness to a burst error capable of being generated on a transport channel.

The demux 4030 may determine and output an order of the input bitstream. The constellation mapper 4040 may map an input bit word to one constellation. The constellation rotation and cyclic Q-delay block 4050 may rotate a cell on a complex number plane and may cyclically delay an imaginary part in an FEC block by one cell.

The cell interleaver 4060 may randomly mix and output cells corresponding to one FEC block. Cells corresponding to each FEC block may be output in a different order for each FEC block.

The time interleaver 4070 may mix and output cells which belong to several FEC blocks. Cells corresponding to each FEC block may be distributed and transmitted within an interval by a time interleaving length.

Figure 5:
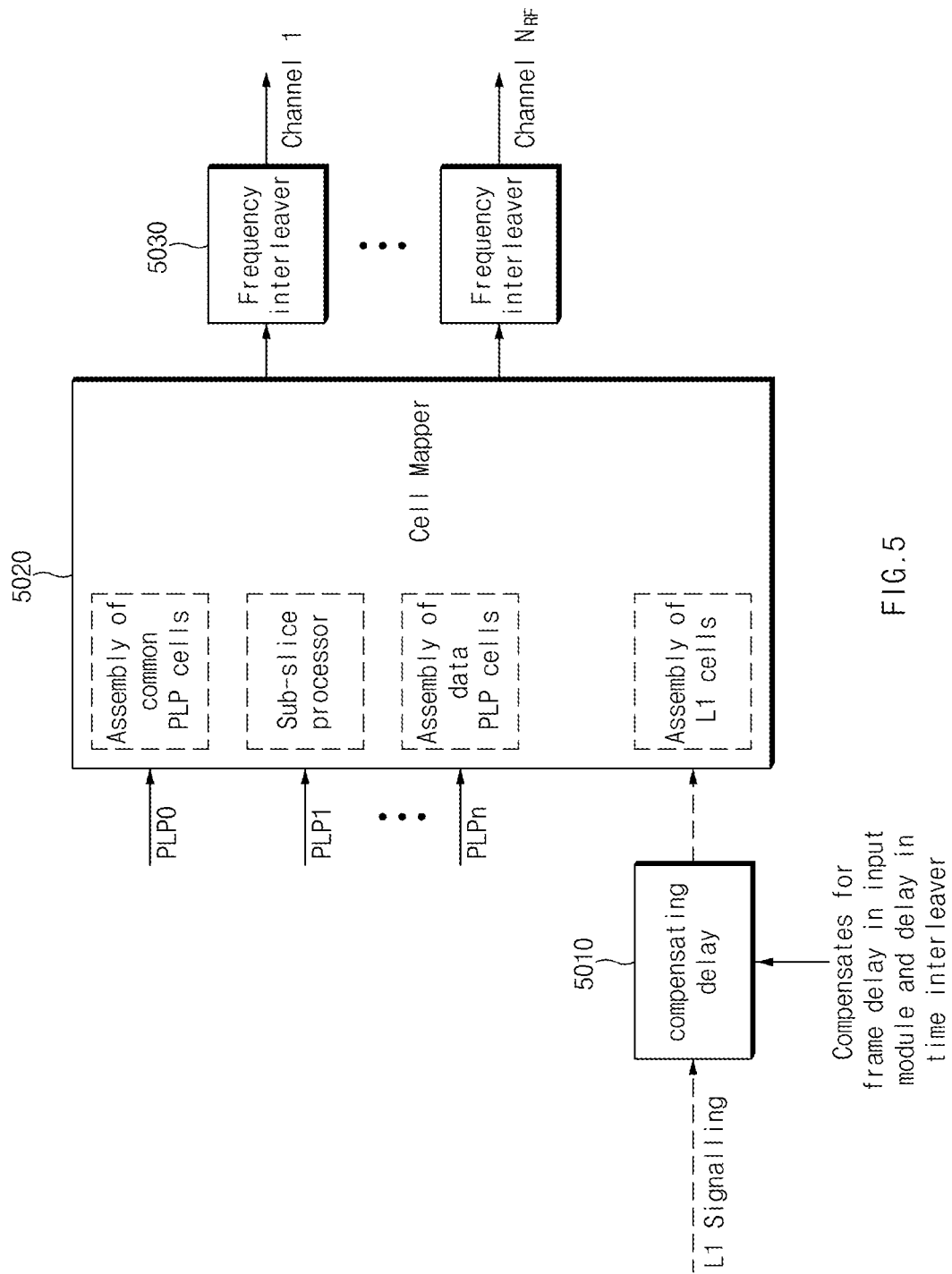
FIG. 5 is a block diagram illustrating a configuration of a frame builder.

FIG. 5 is a block diagram illustrating a configuration of a frame builder.

A frame builder (e.g., a frame builder 130 of FIG. 1) may include a compensating delay block 5010, a cell mapper 5020, and a frequency interleaver 5030.

The compensating delay block 5010 may process a delay due to an input block (e.g., an input processing block 110 of FIG. 1) and a BICM block (e.g., a BICM block 120 of FIG. 1).

The cell mapper 5020 may map input cells depending on scheduling information output from a scheduler (e.g., a scheduler 3010 of FIG. 3). The cell mapper 5020 may map a PLP, an auxiliary stream, a dummy cell, or the like to an active carrier of an OFDM symbol in a frame. The cell mapper 5020 may map a data cell to an array of an active OFDM cell corresponding each of OFDM symbols in a frame.

The frequency interleaver 5030 may randomly interleave the data cell received from the cell mapper 5020 and may provide frequency diversity.

Figure 6:
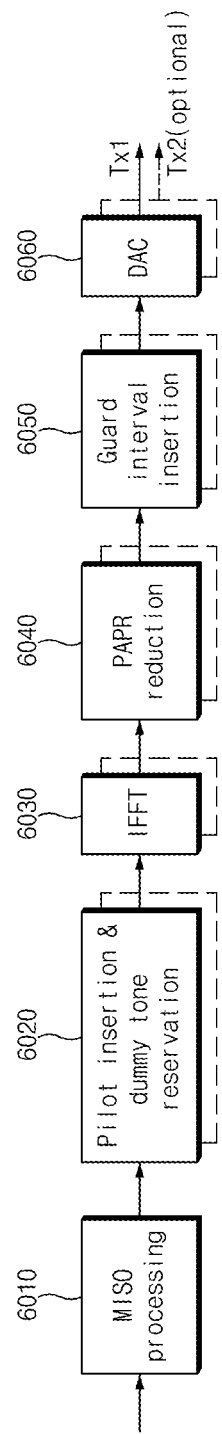
FIG. 6 is a block diagram illustrating an OFDM generation block.

FIG. 6 is a block diagram illustrating an OFDM generation block.

Referring to FIG. 6, an OFDM generation block (e.g., an OFDM generation block 140 of FIG. 1) may include a MISO processing block 6010, a pilot insertion and dummy tone reservation block 6020, an inverse fast Fourier transform (IFFT) block 6030, a peak to average power ratio (PAPR) reduction block 6040, a guard interval (GI) insertion block 6050, a digital to analogue conversion (DAC) block 6060.

The MISO processing block 6010 may be used for a MISO transmission mode. The MISO processing block 6010 may perform an encoding process of pairs of OFDM payload cells from an output of a frequency interleaver (e.g., a frequency interleaver 5030 of FIG. 5). MISO processing is not applicable to a preamble (hereinafter, a P1 symbol) indicating a transmission type and a default transmission parameter. The P1 symbol may be the same as each other between transmitters. An Alamouti code may be used for MISO processing.

The pilot insertion and dummy tone reservation block 6020 may insert a pilot and a dummy tone into a frame. The pilot may be inserted into a predefined location. The pilot may be used for frame synchronization, frequency synchronization, time synchronization, channel estimation, or transmission mode identification. A receiving device may perform channel estimation based on a pilot and may correct a frequency offset. The dummy tone may be selectively used to reduce a PAPR.

The IFFT block 6030 may convert the frame into which the pilot and the dummy tone are inserted into a signal on a time axis.

The PAPR reduction block 6040 may calculate a PAPR pilot level in the converted signal on the time axis and may reduce a level of a PAPR.

The GI insertion block 6050 may insert a guard interval into each symbol of a signal output from the PAPR reduction block 6040 to prevent inter-symbol interference.

The DAC block 6060 may convert a spectrum-formed signal into an analog signal and may transmit the converted analog signal.

Figure 7:
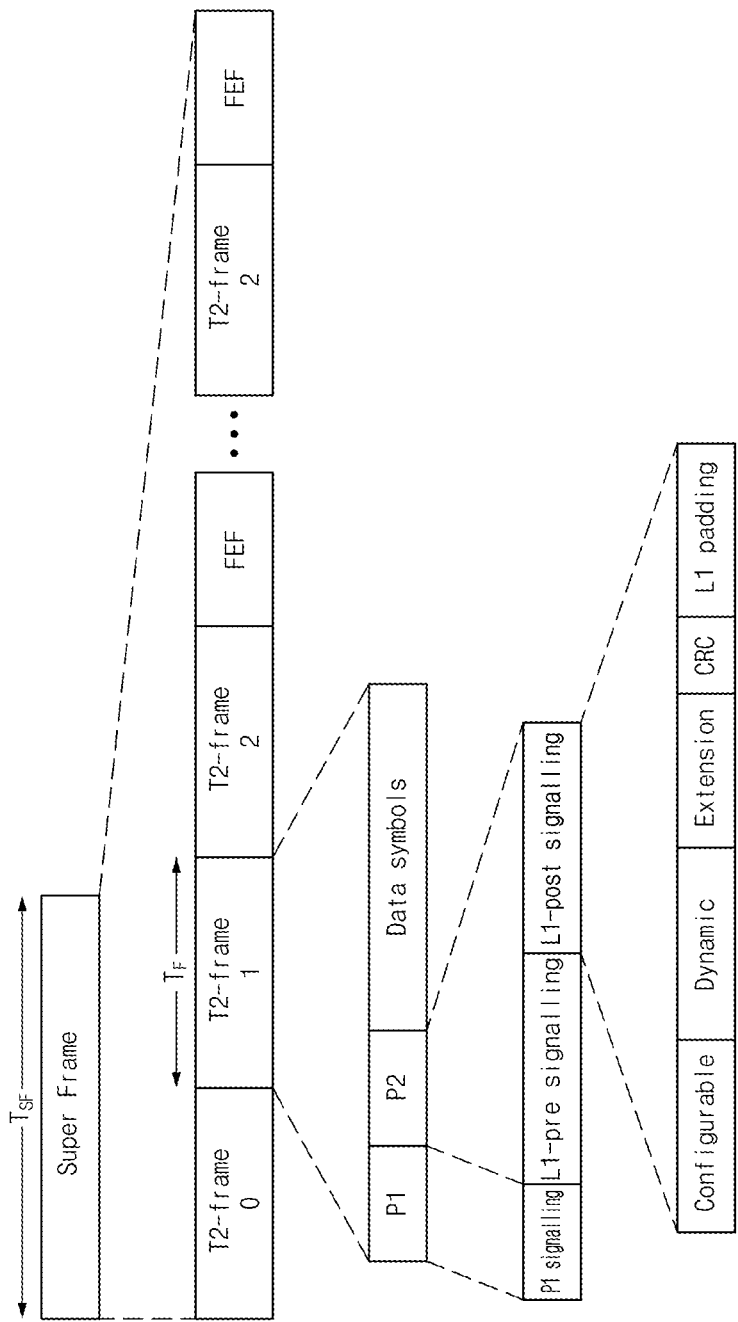
FIG. 7 illustrates a frame structure according to an embodiment.

FIG. 7 illustrates a frame structure according to an embodiment.

Referring to FIG. 7, the frame structure according to an embodiment may be configured with super frames. The super frame may include a plurality of T2 frames. In an embodiment, the super frame may include a future extension frame (FEF) portion. The T2 frames may include OFDM symbols.

The T2 frame may include one P1 symbol, one or more P2 symbols, and data symbols. In an embodiment, the T2 frame may further include a guard interval and a pilot pattern. The P2 symbols may be located immediately after P1 symbols. The P2 symbols may be used to transmit L1 signaling data. The data symbol may be a symbol in which broadcast data is transmitted. The data symbol may be configured with one or more PLPs.

L1 signaling may include P1 signaling, L1-pre signaling, or L1-post signaling. The other signaling except for the P1 signaling may be performed in the P2 symbol. The L1-pre signaling may include information necessary to access the L1-post signaling. The L1-post signaling may include information necessary for a receiving device to access a PLP. A receive end may obtain information about a scheme in which data is transmitted through the L1 signaling, a frame length, or the like and may receive broadcast data through a PLP.

The L1-post signaling may include a parameter which provides information suitable for decoding a PLP at a receiver. The L1-post signaling may include two types of parameters (configurable, dynamic). The L1-post signaling may optionally include an extension field. In an embodiment, a 32-bit error detection code or CRC-32 is applicable to the L1 signaling. When the L1-post signaling is segmented into multiple blocks, it may include L1 padding inserted to keep a size of LDPC blocks constant.

Figure 8:
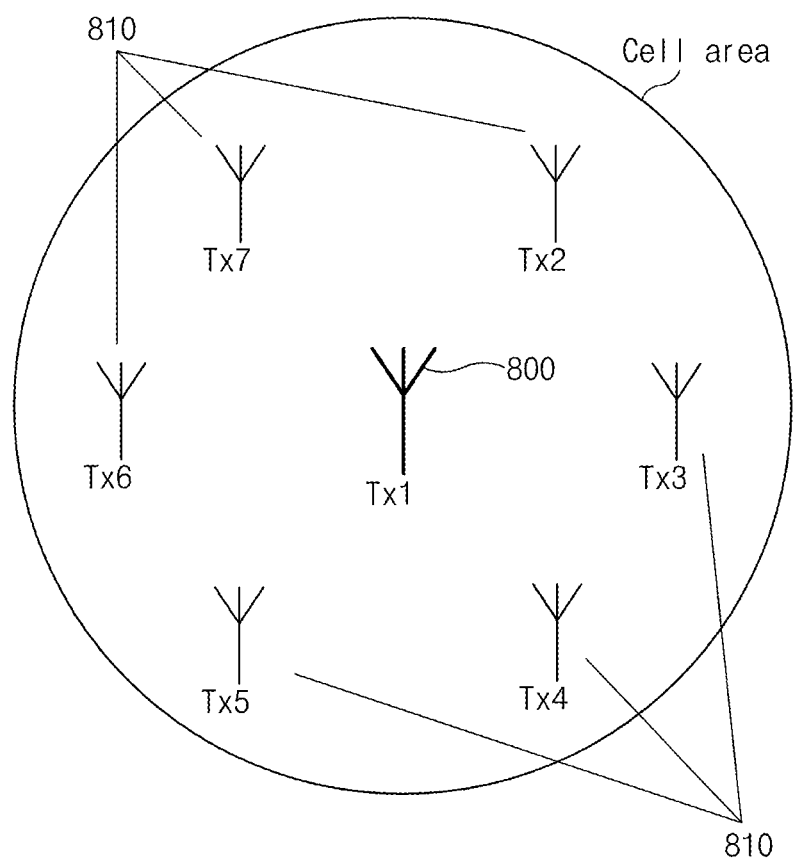
FIG. 8 illustrates an example of a broadcast environment applicable to various embodiments.

FIG. 8 illustrates an example of a broadcast environment applicable to various embodiments.

According to an embodiment disclosed in the disclosure, a cell area may be a physical or logical area where a receiver receives the same content or data during a constant time interval. One cell area may include a plurality of transmitters 800 and 810 which transmit the same content or data during a constant time interval. Some of the plurality of transmitters 800 and 810 may transmit different signals to a receiving device.

The one cell area may include the primary transmitter 800 and the secondary transmitters 810. FIG. 8 illustrates that the number of the secondary transmitters 810 is even (or the number of transmitters is odd). The plurality of transmitters 800 and 810 may include the primary transmitter Tx1 800 and the secondary transmitters Tx2, Tx3, Tx4, Tx5, Tx6, and Tx7 810.

Figure 9:
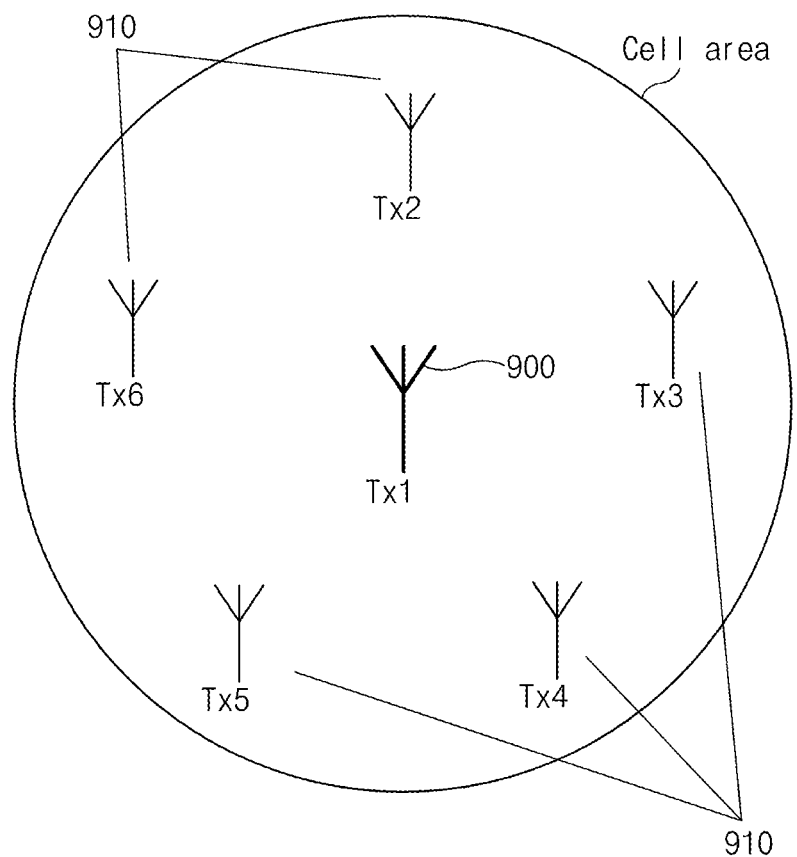
FIG. 9 illustrates another example of a broadcast environment applicable to various embodiments.

FIG. 9 illustrates another example of a broadcast environment applicable to various embodiments.

FIG. 9 illustrates that the number of secondary transmitters 910 is odd (or the number of transmitters is even). In an embodiment, a plurality of transmitters 900 and 910 may include the primary transmitter Tx1 900 and the secondary transmitters Tx2, Tx3, Tx4, Tx5, and Tx6 910.

Hereinafter, a description will be given of grouping a plurality of transmitters in a cell area.

In an embodiment, a plurality of transmitters (e.g., 800 and 810 of FIG. 8) in one cell area may be divided into a plurality of groups. In an embodiment, the plurality of transmitters may include a first group including a primary transmitter and a second group configured with secondary transmitters. In this case, the first group may include only the primary transmitter.

In another embodiment, the plurality of transmitters may be grouped into three or more groups. For example, the plurality of transmitters may be grouped into a first group including a primary transmitter and a second group and a third group, which are grouped according to a specific condition among secondary transmitters. In another embodiment, the plurality of transmitters may be grouped into first to fourth groups grouped according to a specific condition.

Figure 10:
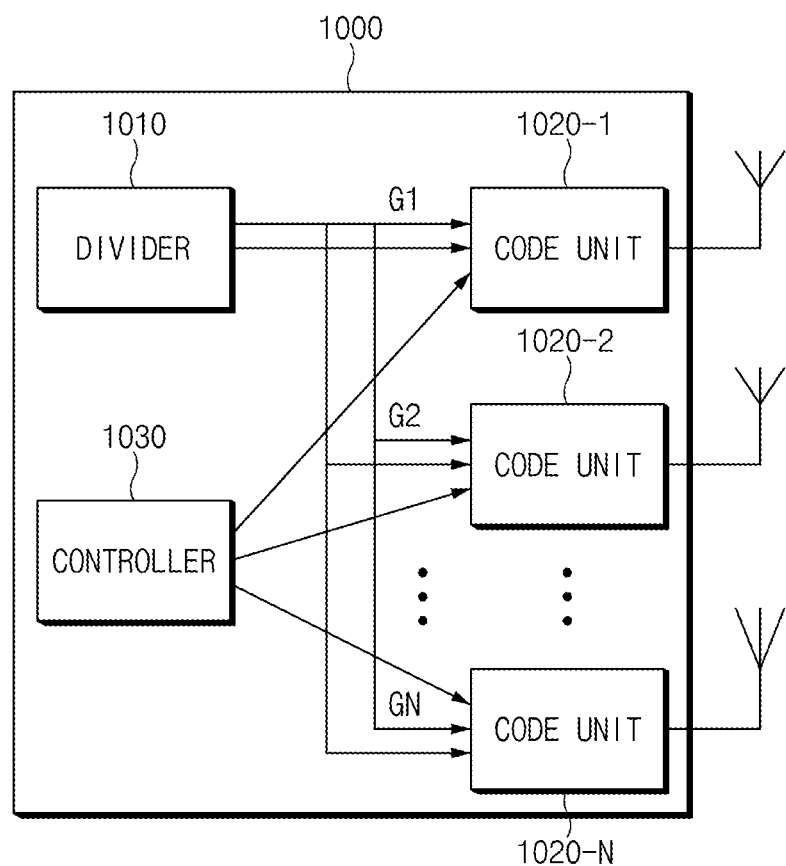
FIG. 10 is a block diagram illustrating a configuration of a transmitting device according to an embodiment.

FIG. 10 is a block diagram illustrating a configuration of a transmitting device according to an embodiment.

Referring to FIG. 10, a transmitting device 1000 may include a divider 1010, a plurality of code units 1020-1, 1020-2, . . . , and 1020-N, and a controller 1030.

The transmitting device 1000 may deliver a frame to a transmitter. The transmitting device 1000 may transmit a signal to a receiving device via the transmitter.

The divider 1010 may divide a data symbol stream. In an embodiment, the divider 1010 may divide the data symbol stream into two symbol streams. In an embodiment, the divider 1010 may divide odd index data symbols in the data symbol stream into a first data symbol stream and may divide even index data symbols into a second data symbol stream. In FIG. 10, for convenience of description, the divider 1010 and the code units 1020-1, 1020-2, ..., and 1020-N are described as independent components. However, the operation performed in the divider 1010 may be performed by the code units 1020-1, 1020-2, ..., and 1020-N. For example, the plurality of code units 1020-1, 1020-2, ..., and 1020-N may obtain a plurality of data symbol streams and may divide the data symbol streams into a first data symbol stream and a second data symbol stream, thus generating an output stream based on the data symbol streams.

Each of the plurality of code units 1020-1, 1020-2, ..., and 1020-N may generate an output stream based on the data symbol stream. The plurality of code units 1020-1, 1020-2, ..., and 1020-N may generate different output streams for the same data symbol stream. The plurality of code units 1020-1, 1020-2, ..., and 1020-N may code the data symbol stream.

Each of the plurality of code units 1020-1, 1020-2, ..., and 1020-N may perform coding using a code parameter determined by the controller 1030. In an embodiment, the code parameters may be p and q. One code unit may generate an output stream for one group by applying the same parameter.

The plurality of code units 1020-1, 1020-2, ..., and 1020-N may perform coding using a linear block code. Some of the plurality of code units 1020-1, 1020-2, ..., and 1020-N may perform coding using an Alamouti code. Each of the plurality of code units 1020-1, 1020-2, ..., and 1020-N may be associated with one transmitter group. One code unit (e.g., 1020-1) may generate the same output stream for a transmitter in the same group. Different code units may be associated with different groups and may generate different output streams for the different groups.

For example, the plurality of code units 1020-1, 1020-2, ..., and 1020-N may divide a data symbol stream into a first data symbol stream and a second data symbol stream and may generate an output stream based on the first data symbol stream and the second data symbol stream. The plurality of code units 1020-1, 1020-2, ..., and 1020-N may generate a first output stream and a second output stream based on the first data symbol stream and the second data symbol stream.

In an embodiment, data symbols coded by the plurality of code units 1020-1, 1020-2, ..., and 1020-N may be transferred to a transmitter. Data symbols coded by the specific code unit 1020-1 among the plurality of code units 1020-1, 1020-2, ..., and 1020-N may be transferred to transmitters in the same group. The coded data symbol streams may include at least one of a p2 symbol or a data symbol. One first output stream and one second output stream may be delivered to one transmitter. First output stream(s) and second output stream(s) generated by one code unit (e.g., 1020-1) may be transmitted to transmitters in one group, respectively.

The controller 1030 may group transmitters. The controller 1030 may group a plurality of transmitters located in a specific cell depending on a constant rule. In an embodiment, the controller 1030 may group a transmitter located in a specific cell based on at least one of geometry, a location, a transmit power level, or an interference pattern. In an embodiment, the controller 1030 may group the plurality of transmitters into three or more groups. The controller 1030 may determine at least one parameter p and q for at least one code unit (e.g., 1020-1) or each group. The controller 1030 may determine a parameter based on the number of transmitter groups.

In embodiment, a MISO processing block (e.g., 610) may include at least one of the divider 1010, the code units 1020-1, 1020-2, ..., and 1020-N, or the controller 1030. The configuration described in FIG. 10 is to describe an embodiment, and may be modified or replaced with various configurations which perform a similar function. For example, at least one of components described in FIG. 1 may be further included.

Figure 11:
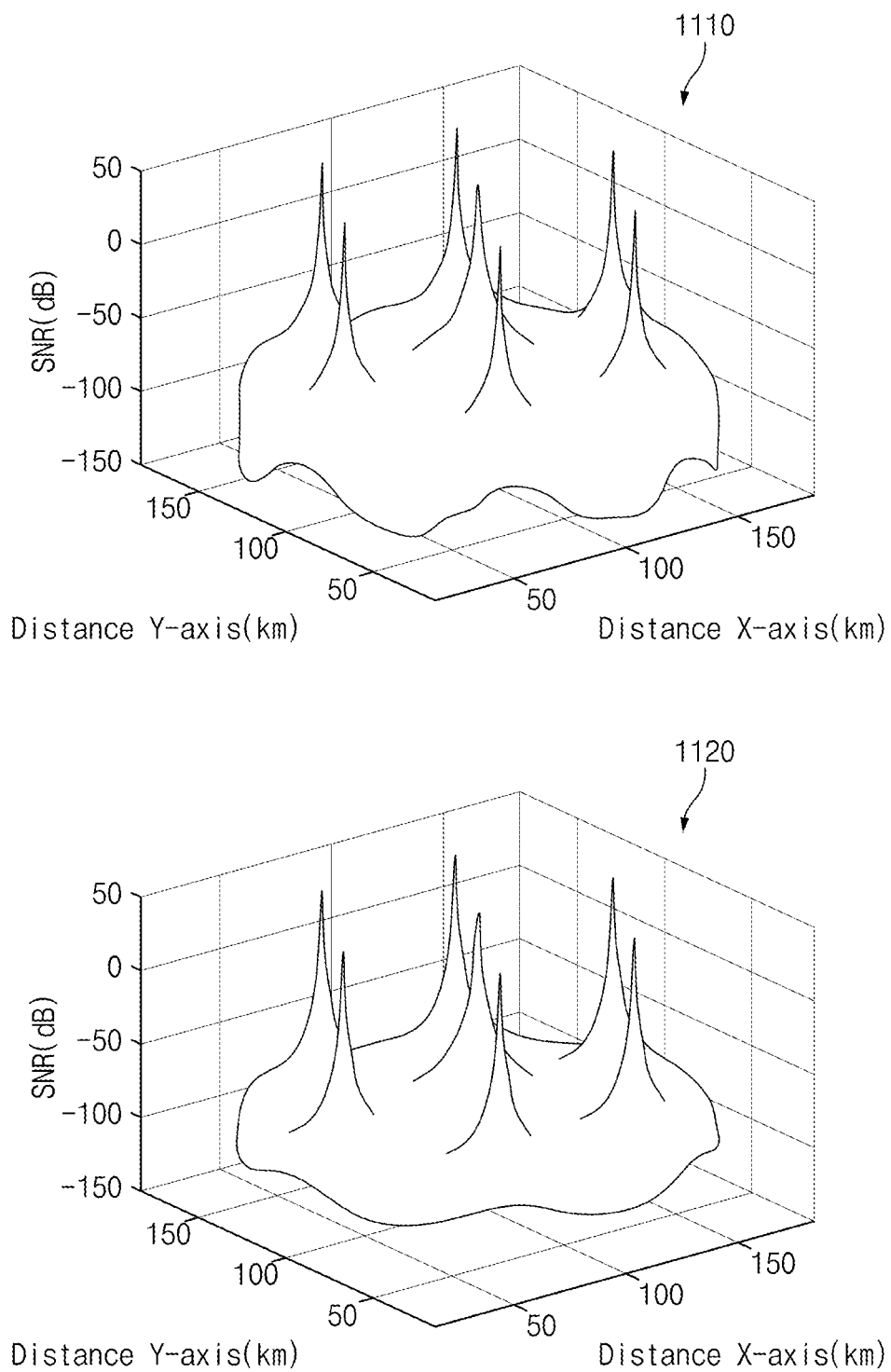
FIG. 11 illustrates an effect of a method for transmitting a broadcast signal according to an embodiment.

FIG. 11 illustrates an effect of a method for transmitting a broadcast signal according to an embodiment. Graph 1110 indicates a signal to noise ratio (SNR) for each area according to an existing MISO transmission method, and graph 1102 indicates an SNR for each area when transmission according to an embodiment disclosed in the disclosure is performed.

Referring to Graphs 1110 and 1120, in graph 1110, an SNR is more stably represented for each area. Referring to Graph 1120, it may be seen that reception performance of an area where an SNR is poor in graph 1110 is enhanced. In other words, according to an embodiment disclosed in the disclosure, an effect of increasing an SNR may be obtained throughout an area.

Figure 12:
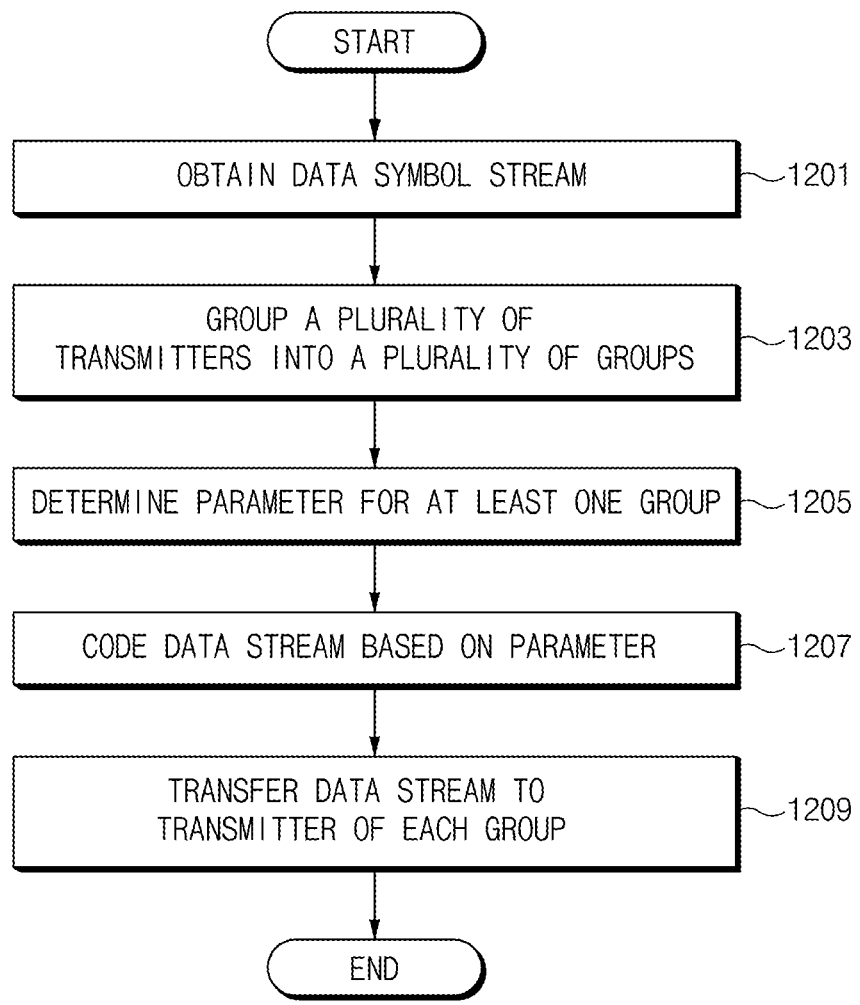
FIG. 12 is a flowchart illustrating an operation of a transmitting device according to an embodiment.

FIG. 12 is a flowchart illustrating an operation of a transmitting device according to an embodiment.

Referring to FIG. 12, in operation 1201, a transmitting device (e.g., a transmitter 800 of FIG. 8) may obtain a data symbol stream. The transmitting device may generate, for example, a data symbol stream depending on a DVB-T2 system.

In operation 1203, the transmitting device may group a plurality of transmitter into a plurality of groups. In an embodiment, the group may be a coding application unit. Each of the plurality of groups according to an embodiment may be associated with a specific code or coding algorithm.

In operation 1205, the transmitting device may determine a parameter for a transmitter group. The transmitting device may determine a parameter for at least one of the plurality of groups. In an embodiment, the transmitting device may determine a parameter value to be applied to at least one group. In an embodiment, the transmitting device may determine a plurality of parameters and may apply the plurality of parameters to coding. For example, the plurality of parameters may include a first parameter and a second parameter. The transmitting device may determine a first parameter value and a second parameter value. In an embodiment, the transmitting device may determine a first parameter for a first group and may determine a second parameter for a second group. In an embodiment, the first parameter value and the second parameter value may be heuristically determined.

In an embodiment, the transmitting device may determine a parameter based on the number of the transmitter groups. For example, when the plurality of groups are three or more groups, the transmitting device may determine a plurality of parameters.

In operation 1207, the transmitting device may code a data stream using the determined parameter. The transmitting device may at least code a data stream for a plurality of transmitter groups based on the parameter to generate an output stream. The transmitting device may apply the same parameter to one group to generate an output stream.

In operation 1209, the transmitting device may deliver the generated signal to a transmitter in a related group. A transmitter in one group may transmit the same output stream to a receiving device. The generated signal may be delivered to a transmitter in a wired or wireless manner. An embodiment disclosed in the disclosure is applicable to various numbers of antennas.

Figure 13:
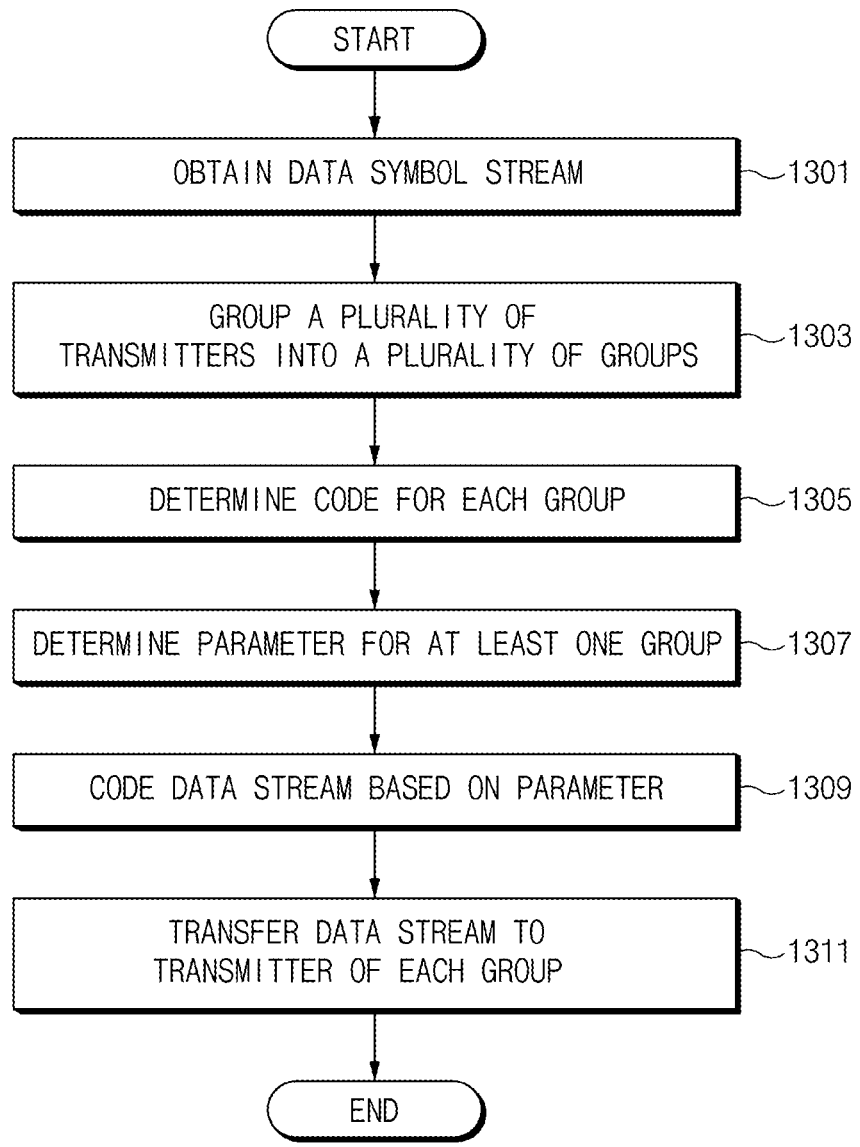
FIG. 13 is a flowchart illustrating an operation of a transmitting device according to an embodiment.

FIG. 13 is a flowchart illustrating an operation of a transmitting device according to an embodiment.

Referring to FIG. 13, in operation 1301, a transmitting device (e.g., a transmitter 800 of FIG. 8) may obtain a data symbol stream. The transmitting device may generate, for example, a data symbol stream depending on a DVB-T2 system. In operation 1301, the transmitting device (e.g., the transmitter 800 of FIG. 8) may generate a data stream (or a data symbol stream) for performing coding.

In operation 1303, the transmitting device may group a plurality of transmitter into a plurality of groups. In an embodiment, the group may be a coding application unit.

In operation 1305, the transmitting device may determine a code to be applied to each group. For example, when a transmitter group includes three groups, the transmitting device may determine a first code with respect to a first group, may determine a second code with respect to a second group, and may determine a third code with respect to a third group.

In operation 1307, the transmitting device may determine a parameter. In an embodiment, the transmitting device may determine a parameter value to be applied to at least one code among the plurality of groups.

In operation 1309, the transmitting device may code a data stream using the determined parameter. The transmitting device may code a data stream to be transmitted to each group based on a parameter determined for each group to generate an output stream. The transmitting device may apply a parameter to a code determined for each group and may code a data stream to be transmitted to each group. The transmitting device may apply the same parameter to one group to generate an output stream.

In operation 1311, the transmitting device may deliver the generated signal to a transmitter in a related group. A transmitter in the same group may transmit the same output stream to a receiving device. The generated signal may be delivered to a transmitter in a wired or wireless manner. An embodiment disclosed in the disclosure is applicable to various numbers of antennas.

Hereinafter, a description will be given of a method for grouping a plurality of transmitters in an electronic device. A transmitter according to an embodiment may include a primary transmitter and a secondary transmitter. The primary transmitter may be distinguished from the secondary transmitter based on a power level. The primary transmitter may be, for example, a transmitter with a considerably higher power level than the secondary transmitter.

In an embodiment, the transmitting device may determine a transmitter grouped into each group, based on at least one of geometry, a location, a power level, or an interference pattern. For example, a first group may include a primary transmitter, and a second group may include the other transmitters except for the primary transmitter.

In another embodiment, the transmitting device may determine the number of the plurality of groups based on the number of transmitters in a cell area or the number of secondary transmitters in a cell.

In an embodiment, as shown in FIG. 8, when the number of the secondary transmitters in the cell is even, the transmitting device may determine the number of the plurality of groups as an odd number. In an embodiment, the number of the groups may be 3. Referring to FIG. 8, in an embodiment, a first group may include Tx1. A second group may include Tx2, Tx4, and Tx6. A third group may include Tx3, Tx5, and Tx7.

As shown in FIG. 9, when the number of the secondary transmitters in the cell is odd, the transmitting device may determine the number of the plurality of groups as an even number. In an embodiment, the number of the groups may be 4. Referring to FIG. 9, in an embodiment, a first group may include Tx1, and a second group may include Tx2 and Tx4. A third group may include Tx3 and Tx5. A fourth group may include Tx6. Tx1 according to an embodiment may be a primary transmitter.

Hereinafter, a description will be given of a method for generating an output stream in an electronic device. The electronic device according to various embodiments disclosed in the disclosure may generate an output stream for a data stream using a method described below.

The transmitting device according to an embodiment may separate, for example, a first data stream and a second data stream and may generate a first output stream and a second output stream based on the first data stream and the second data stream. In an embodiment, the first data stream may include symbols at even-numbered positions among symbols configuring a data stream. The second data stream may include symbols at odd-numbered positions among the symbols configuring the data stream. An embodiment disclosed in the disclosure may use two time and/and frequency slots. In an embodiment, a first output stream may be transmitted at a first time interval (or first transmission timing) or a first frequency domain. In an embodiment, a second output stream may be transmitted at a second time interval (or second transmission timing) or a second frequency domain. In an embodiment, when the plurality of groups are 2, the transmitting device may generate the same first output steam as a first data stream and a second output stream which is a value taking the negative of a complex conjugate value of a second data stream, with respect to a first group. The transmitting device may generate the same first output steam as the second data stream and a second output stream which is a complex conjugate value of the first data stream, with respect to a second group.

Table 1 is a drawing illustrating a first output stream and a second output stream, coded and output according to an embodiment, depending on a transmitter and over time.

TABLE 1

| | Tx1 | Tx2 | Tx3 | Tx4 | Tx5 | Tx6 | Tx7 |
|---|---|---|---|---|---|---|---|
| T | $x_0$ | $x_1$ | $x_1$ | $x_1$ | $x_1$ | $x_1$ | $x_1$ |
| t + T | $-x_1^*$ | $x_0^*$ | $x_0^*$ | $x_0^*$ | $x_0^*$ | $x_0^*$ | $x_0^*$ |

$x_0$ may indicate the first data stream, and $x_1$ may indicate the second data stream. Referring to Table 1, a first group may include Tx1, and a second group may include Tx2 to Tx7. Herein, Tx1 may be a primary transmitter.

The transmitting device may perform coding for an input data stream such that a first output stream transmitted at time t is $x_0$ with respect to the first group and is $x_1$ with respect to the second group. The transmitting device may generate the first output stream for the first group based on a first input stream and may generate the first output stream for the second group based on a second input stream.

The transmitting device may perform coding for an input data stream such that a second output stream transmitted at time t+T is $-x_1^*$ with respect to the first group and is $x_0^*$ with respect to the second group. The transmitting device may generate the second output stream for the first group based on the second input stream and may generate the second output stream for the second group based on the first input stream.

In another embodiment, the transmitting device may code a data stream with respect to three groups to generate an output stream. For example, the transmitting device may output the same first output stream as a first data stream with respect to a first group. The transmitting device may take a negative value of a complex conjugate of a second data stream with respect to the first group to output a second output stream. The transmitting device may perform coding based on a parameter with respect to a second group and a third group. The transmitting device may determine to use a first parameter with respect to the second group and use a second parameter with respect to the third group. Table 2 below is a drawing illustrating a first output stream and a second output stream, output according to an embodiment, depending on a transmitter and over time.

TABLE 2

| | Tx1 | Tx2 | Tx3 | Tx4 | Tx5 | Tx6 | Tx7 |
|---|---|---|---|---|---|---|---|
| T | $x_0$ | $px_0 + \sqrt{1-p^2}x_1$ | $qx_0 + \sqrt{1-q^2}x_1$ | $px_0 + \sqrt{1-p^2}x_1$ | $qx_0 + \sqrt{1-q^2}x_1$ | $px_0 + \sqrt{1-p^2}x_1$ | $qx_0 + \sqrt{1-q^2}x_1$ |
| t + T | $-x_1^*$ | $\sqrt{1-p^2}x_0^* - px_1^*$ | $\sqrt{1-q^2}x_0^* - qx_1^*$ | $\sqrt{1-p^2}x_0^* - px_1^*$ | $\sqrt{1-q^2}x_0^* - qx_1^*$ | $\sqrt{1-p^2}x_0^* - px_1^*$ | $\sqrt{1-q^2}x_0^* - qx_1^*$ |

$x_0$ may indicate the first data stream, and $x_1$ may indicate the second data stream. Referring to Table 1, a first group may include Tx1, and a second group may include Tx2, Tx4, and Tx6. A third group may include Tx3, Tx5, and Tx7. Herein, Tx1 may be a primary transmitter.

Referring to Table 2, the transmitting device may output $x_0$ as a first output stream with respect to the first group transmitted at time t. The transmitting device may generate a first output stream using a first parameter p with respect to the second group and may generate a first output stream using a second parameter q with respect to the third group.

The transmitting device may generate a second output stream transmitted at time t+T. The transmitting device may output $-x_1^*$ with respect to the first group. The transmitting device may generate a second output stream using the first parameter with respect to the second group and may generate a second output stream based on the second parameter with respect to the third group.

The transmitting device may generate a first output stream based on a first data stream and a second data stream and may generate a second output stream based on the first data stream and the second data stream with respect to the second group and the third group.

In another embodiment, the transmitting device may code a data stream with respect to four groups to generate an output stream. The transmitting device may generate an output stream to be the same as there are three transmission groups with respect to first to third groups. The transmitting device may output a complex conjugate value of a second data stream and a first data stream with respect to the fourth group. Table 3 is a drawing illustrating a first output stream and a second output stream, coded and output according to an embodiment, depending on a transmitter and over time.

$x_0$ may indicate the first data stream, and $x_1$ may indicate the second data stream. Referring to Table 3, a first group may include Tx1, a second group may include Tx2 and Tx4, a third group may include Tx3 and Tx5, and a fourth group may include Tx6. Herein, Tx1 may be a primary transmitter.

Referring to Table 3 above, the transmitting device may generate a first output stream and a second output stream for the second group based on the first data stream, the second data stream, and a first parameter. The transmitting device may generate a first output stream and a second output stream for the third group based on the first data stream, the second data stream, and a second parameter. The transmitting device may generate a first output stream for the fourth group based on the second data stream and may generate a second output stream for the fourth group based on the first data stream.

Figure 14:
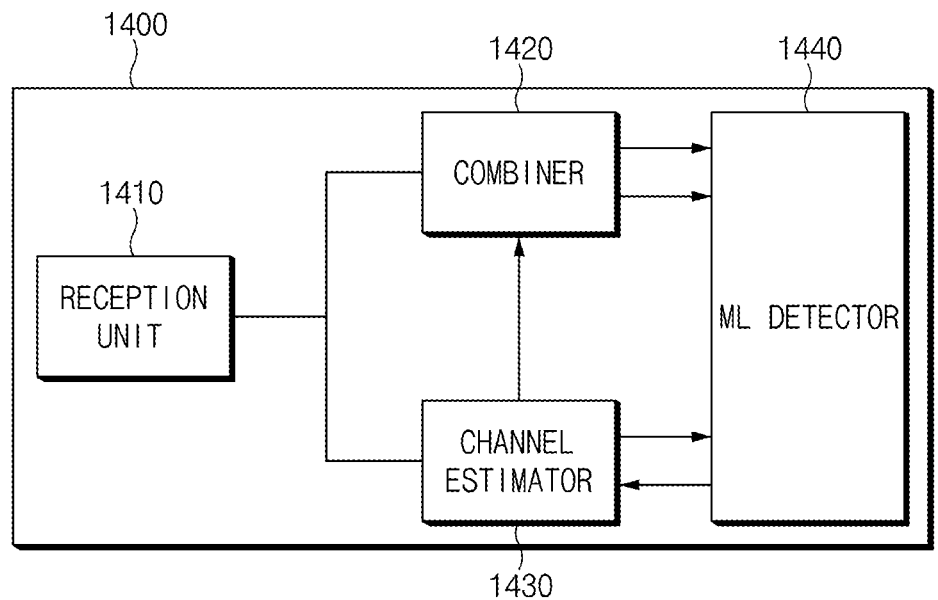
FIG. 14 is a block diagram illustrating a configuration of a receiving device according to an embodiment.

FIG. 14 is a block diagram illustrating a configuration of a receiving device according to an embodiment.

A receiving device 1400 may include a reception unit 1410, a combiner 1420, a channel estimator 1430, and a maximum likelihood (ML) detector 1440.

The reception unit 1410 may receive a signal transmitted from a transmitting device (e.g., a transmitting device 100 of FIG. 1). The combiner 1420 may combine a signal received in a first interval and a signal received in a second interval. The combiner 1420 may perform first estimation of a transmit signal using an output of the channel estimator 1430. The ML detector 1440 may determine a standard minimum distance. Hereinafter, a description will be given in detail of an operation of each block.

Gaussian noise may be added at a receiver, a signal may be received in the form of a linear combination of a transmit signal diminished by a channel. A signal received in two consecutive time slots may be represented as Equations 1 and 2 below.

$$r_0 = ax_0 + bx_1 + n_0 \quad \text{[Equation 1]}$$

$$r_1 = bx_0^* + ax_1^* + n_1 \quad \text{[Equation 2]}$$

In Equations 1 and 2, a and b may be constants which rely on at least one of a channel state, geometry, or a transmission parameter value. $n_0$ and $n_1$ may be Gaussian noise vectors.

The channel estimator 1430 may determine a coefficient of a receive signal. The channel estimator 1430 may estimate a and b. The channel estimator 1430 may estimate a and b using consecutive pilot signals $s_0$ and $s_1$ and receive

TABLE 3

| | Tx1 | Tx2 | Tx3 | Tx4 | Tx5 | Tx6 |
|---|---|---|---|---|---|---|
| t | x0 | $px_0 + \sqrt{1-p^2}x_1$ | $qx_0 + \sqrt{1-q^2}x_1$ | $px_0 + \sqrt{1-p^2}x_1$ | $qx_0 + \sqrt{1-q^2}x_1$ | x1 |
| t + T | $-x1^*$ | $\sqrt{1-p^2}x_0^* - px_1^*$ | $\sqrt{1-q^2}x_0^* - qx_1^*$ | $\sqrt{1-p^2}x_0^* - px_1^*$ | $\sqrt{1-q^2}x_0^* - qx_1^*$ | x0* | signals $R_0$ and $R_1$. The pilot signal may be a value the receiving device 1400 already knows. The channel estimator 1430 may perform channel estimation based on Equations 3 to 6 below.

$$R_0 = as_0 + bs_1 + N_0 \qquad \text{[Equation 3]}$$

$$R_1 = bs_0^* - as_1^* + N_1 \qquad \text{[Equation 4]}$$

$$\bar{a} = \frac{R_0 s_0^* - R_1 s_1}{|s_0|^2 + |s_1|^2} = a + \frac{s_0^* N_0 - s_1 N_1}{|s_0|^2 + |s_1|^2} \qquad \text{[Equation 5]}$$

$$\bar{b} = \frac{R_0 s_1^* + R_1 s_0}{|s_0|^2 + |s_1|^2} = b + \frac{s_1^* N_0 - s_1 N_1}{|s_0|^2 + |s_1|^2} \qquad \text{[Equation 6]}$$

$\bar{a}$ may be the measured value of a measured by the channel estimator 1430, and $\bar{b}$ may be the measured value of b measured by the channel estimator 1430.

The combiner 1420 may receive a first signal in a first time interval, may buffer the received signal, may receive a second signal in a next time interval, and may combine the received signals to obtain first estimation of a transmitted signal. The combiner 1420 may combine the received signals and may reconstruct a data stream as Equations 7 and 8 below. The combiner 1420 may use a measurement result obtained from the channel estimator 1430.

$$\bar{x}_0 = \bar{a}^* r_0 + \bar{b} r_1^* / |\bar{a}|^2 + |\bar{b}|^2 \qquad \text{[Equation 7]}$$

$$\bar{x}_1 = \bar{b}^* r_0 - \bar{a} r_1^* / |\bar{a}|^2 + |\bar{b}|^2 \qquad \text{[Equation 8]}$$

$\bar{x}_0$ may be the first reconstruction stream in which the first data stream is reconstructed, and $\bar{x}_1$ may be the second reconstruction stream in which the second data stream is reconstructed.

The first estimation may be forwarded to the ML detector 1440. For example, the first reconstruction stream and the second reconstruction stream may be forwarded to the ML detector 1440. The ML detector 1440 may reconstruct an original signal using minimum distance criteria.

Figure 15:
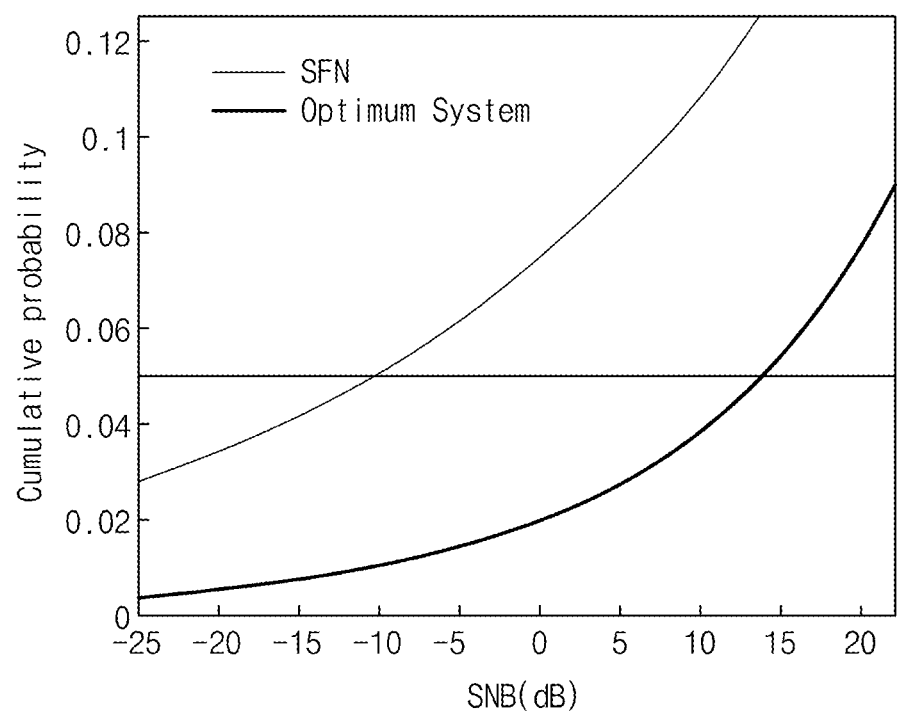
FIG. 15 illustrates a graph for comparing signal reception performance in a receiving device.

FIG. 15 illustrates a graph for comparing signal reception performance in a receiving device.

FIG. 15 is an example of calculating a cumulative probability of a receive signal assuming that a cell radius is 100 km. A 5-percent outage SNR may indicate an SNR when a signal is received at an SNR greater than a corresponding value in a 95-percent area in a corresponding area. According to a conventional SFN technique, a 5-percent outage SNR is about −10 dB. According to an embodiment disclosed in the disclosure, a 5-percent outage SNR is about 5 dB. According to an embodiment, an effect of enhancing the 5-percent outage SNR may be obtained. According to an embodiment disclosed in the disclosure, more receivers may obtain the same SNR in a constant area, or the receivers may obtain a higher SNR in an area of the same rate.

Table 4 is a table of comparing effects of a conventional MISO transmission technique and a transmission technique based on an embodiment disclosed in the disclosure.

TABLE 4

| Cell radius | Tower distance | SFN outage value (dB) | Table 2 (or Table 3) | p (Table 2) | q (Table 2) |
|---|---|---|---|---|---|
| 90 Km | 60 Km | 0.51 dB | 9.85 dB | −0.49 | 0.49 |
| 100 Km | 60 Km | −5.71 dB | 4.06 dB | −0.41 | 0.41 |
| 115 Km | 60 Km | −14.06 dB | −3.29 dB | −0.39 | 0.39 |
| 115 Km | 70 Km | −9.74 dB | −0.1 dB | −0.46 | 0.46 |
| 115 Km | 70 Km (pentagonal case) | −12.24 dB | −1.39 dB | −0.17 | 0.17 |

TABLE 4-continued

Referring to Table 4, according to an embodiment disclosed in the disclosure, a receiving device may obtain an SNR enhancement effect. The SNR enhancement effect may be obtained for both of when grouped into a first group including a primary transmitter and a second group including a plurality of secondary transmitters in Table 1 and when grouping secondary transmitters into a plurality of groups in Table 2 or the like. Furthermore, according to an embodiment disclosed in the disclosure, space diversity may be obtained using a comparatively small number of antennas. According to embodiments disclosed in the disclosure, time diversity and frequency diversity may be obtained using a small time or frequency. According to embodiments disclosed in the disclosure, a transmitting device may perform coding and decoding using a simple arithmetic operation, for example, scalar multiplication, sum, or conjugate calculation.

The term "module" used in the disclosure may represent, for example, a unit including one or more combinations of hardware, software and firmware. The term "module" may be interchangeably used with the terms "unit", "logic", "logical block", "part" and "circuit". The "module" may be a minimum unit of an integrated part or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing some operations, which are known or will be developed.

At least a part of an apparatus (e.g., modules or functions thereof) or a method (e.g., operations) according to various embodiments may be, for example, implemented by instructions stored in a computer-readable storage media in the form of a program module. The instruction, when executed by a processor, may cause the one or more processors to perform a function corresponding to the instruction. The computer-readable storage media, for example, may be the memory.

A computer-readable recording medium may include a hard disk, a floppy disk, a magnetic media (e.g., a magnetic tape), an optical media (e.g., a compact disc read only memory (CD-ROM) and a digital versatile disc (DVD), a magneto-optical media (e.g., a floptical disk)), and hardware devices (e.g., a read only memory (ROM), a random access memory (RAM), or a flash memory). Also, the one or more instructions may contain a code made by a compiler or a code executable by an interpreter. The above hardware unit may be configured to operate via one or more software modules for performing an operation according to various embodiments, and vice versa.

A module or a program module according to various embodiments may include at least one of the above components, or a part of the above components may be omitted, or additional other components may be further included. Operations performed by a module, a program module, or other components according to various embodiments may be executed sequentially, in parallel, repeatedly, or in a heuristic method. In addition, some operations may be executed in different sequences or may be omitted. Alternatively, other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. A transmitting device, comprising:
a controller configured to group a plurality of transmitters into a plurality of groups including three or more groups; and
a plurality of code units configured to generate different output streams based on a data stream with respect to the plurality of groups,
wherein the controller is configured to deliver the output streams to the plurality of groups,
wherein the data stream includes a first data stream and a second data stream,
wherein the plurality of code units are configured to generate a first output stream and a second output stream,
wherein the first output stream is mapped at first transmission timing, and
wherein the second output stream is mapped at second transmission timing subsequent to the first transmission timing.

2. The transmitting device of claim 1, wherein the controller is configured to determine a parameter based on the number of the groups, and
wherein at least one of the plurality of code units is configured to generate the output stream based on the determined parameter.

3. The transmitting device of claim 1, wherein an output stream for one group is a stream applying a same parameter.

4. The transmitting device of claim 1, wherein one of the plurality of groups includes a primary transmitter.

5. The transmitting device of claim 4, wherein others of the plurality of groups include at least one secondary transmitter.

6. The transmitting device of claim 1, wherein the controller is configured to determine the number of the groups based on a number of plurality of transmitters.

7. The transmitting device of claim 1, wherein the controller is configured to group the plurality of transmitters based on at least one of geometry, a power level, or an interference pattern.

8. The transmitting device of claim 1, wherein the data stream includes a first data stream and a second data stream, and
wherein the plurality of code units are configured to generate a first output stream and a second output stream.

9. The transmitting device of claim 1, wherein the data stream is generated based on a DVB-T2 system.

10. A transmitting device, comprising:
a controller configured to group a plurality of transmitters into a plurality of groups including three or more groups; and
a plurality of code units configured to generate different output streams based on a data stream with respect to the plurality of groups,
wherein the controller is configured to deliver the output streams to the plurality of groups,
wherein the data stream includes a first data stream and a second data stream,
wherein the plurality of code units are configured to generate a first output stream and a second output stream, and
wherein at least one code unit of the plurality of code units is configured to generate the first output stream based on a linear combination of the first data stream and the second data stream.

11. The transmitting device of claim 10, wherein another of the plurality of code units is configured to:
generate the first output stream as the first data stream; and
generate the second output stream based on the second data stream.

12. The transmitting device of claim 11, wherein another code unit of the plurality of code units is configured to generate the second output stream as the second data stream.

13. The transmitting device of claim 11, wherein the at least one code unit is configured to generate an output stream for a group including at least one secondary transmitter, and
wherein the other code unit is configured to generate an output stream for a group including a primary transmitter.

14. A method for transmitting a broadcast signal in a transmitting device, the method comprising:
grouping a plurality of transmitters into a plurality of groups including three or more groups; and
generating different output streams based on a data stream with respect to the plurality of groups,
wherein the data stream includes a first data stream and a second data stream,
wherein the different output streams include a first output stream and a second output stream,
wherein the first output stream is mapped at first transmission timing, and
wherein the second output stream is mapped at second transmission timing subsequent to the first transmission timing.

* * * * *